Aug. 8, 1967 M. FISCHMAN ETAL 3,335,290

TRANSISTORIZED FREQUENCY MULTIPLIER AND AMPLIFIER CIRCUITS

Filed Dec. 30, 1964

INVENTOR.
MARTIN FISCHMAN
EDWARD A. MURPHY

BY R. J. Frank

ATTORNEY.

United States Patent Office 3,335,290
Patented Aug. 8, 1967

3,335,290
TRANSISTORIZED FREQUENCY MULTIPLIER AND AMPLIFIER CIRCUITS

Martin Fischman, Wantagh, and Edward A. Murphy, Farmingdale, N.Y., assignors to General Telephone and Electronics Laboratories, Inc., a corporation of Delaware Filed Dec. 30, 1964, Ser. No. 422,108
11 Claims. (Cl. 307—88.5)

ABSTRACT OF THE DISCLOSURE

A frequency multiplier in which an input signal is coupled to the base electrodes of a pair of transistors by a series resonant circuit tuned to the input frequency. An output signal is generated which is an even harmonic of the frequency.

An amplifier circuit is also disclosed which incorporates a series resonant network in the input circuit.

This invention relates to transistorized circuits and in particular to transistorized frequency multiplier and amplifier circuits.

Frequency multipliers are often used in radio transmitting equipment to generate harmonics of a crystal controlled oscillator or for increasing the deviation of a frequency modulated source. One arrangement for obtaining frequency multiplication consists of a "push-push" circuit employing a pair of vacuum tubes. In such a circuit, the input grids of the tubes are driven in phase opposition and the plate terminals are connected to a common output terminal. This circuit is particularly effective as a frequency doubler since the output current is characterized by the presence of a very strong second harmonic and by the absence of the fundamental input frequency.

Proper operation of a "push-push" frequency multiplier circuit requires good amplitude and phase balance in the input circuit. In vacuum tube circuits, this requirement is easily met by driving the input grids with a tuned center-tapped transformer. However, if the vacuum tubes are replaced by transistors it is found that the center-tapped transformer no longer provides a satisfactory input circuit. The low input impedances of the transistors and the resultant circuit loading require a tapped transformer with a large turns ratio. Consequently, it is difficult to maintain the necessary phase and amplitude balance in the transformer particularly at frequencies above 10 megacycles. In tuned transistorized "push-pull" amplifiers, similar problems are encountered. The low input impedances of the transistors make it very difficult to obtain proper phase and amplitude balance when a center-tapped transformer is used to drive the amplifier.

Accordingly, it is an object of our invention to provide improved frequency doubler and amplifier circuits employing transistors.

It is another object to provide transistorized frequency doubler and amplifier circuits in which phase and amplitude balance are inherently obtained.

A further object is to provide transistorized frequency doubler and amplifier circuits which may be used at relatively high frequencies.

In the present invention, a circuit is provided which comprises first and second transistors each having first, second and third electrodes. The first and third electrodes of the first transistor are coupled to the first and third electrodes respectively of the second transistor. A series resonant circuit is coupled between the second electrodes of the first and second transistor and means are provided for coupling a signal in series with the resonant circuit.

In one embodiment of the invention employed as a frequency multiplier, the series resonant circuit is tuned to the input signal frequency and comprises the secondary of an input transformer and a capacitor. The resonant circuit is connected between the base electrodes of the first and second transistor, the input signal being inductively coupled into the secondary of the input transformer. A second resonant circuit, tuned to an even harmonic of the input frequency, is coupled to the collector electrodes of the transistors.

In general, the input impedance between the base and emitter electrodes of a transistor is low compared with that normally existing between the grid and cathode of a vacuum tube. Consequently, the Q of the input loop comprising the series resonant circuit and the base-emitter portions of the transistor can be made quite high. That is, the ratio of the inductive reactance of the input transformer secondary at the input signal frequency is many times greater than the total resistance of the input loop. The current flowing in the base-emitter portions of each transistor is the same and therefore the input current is balanced both in amplitude and phase.

In the circuit thus far described, the input loop current flows through the base-emitter portions of the transistors during the entire input signal cycle. This requires that transistors having low (less than 5 volts) base-to-emitter reverse breakdown voltage be employed. If it is desired to use transistors having higher reverse breakdown voltages, external diodes may be coupled between the base and emitter of each transistor to provide a signal return for the input loop when the base-emitter portions of the transistor are not conducting. In addition, capacitors may be used to deliberately unbalance the base current amplitudes to compensate for asymmetries in the transistor characteristics.

A similar circuit may be used to obtain push-pull amplifier employing our invention. In the amplifier circuit, a series resonant circuit is connected between the base electrodes of a pair of transistors and the emitter electrodes of the transistors are coupled together as in the frequency multiplier circuit. However, unlike the frequency multiplier, a parallel resonant circuit tuned to the input signal frequency is coupled between the collector electrodes of the transistors.

The above objects of and the brief introduction to the present invention will be more fully understood and further objects and advantages will become apparent from a study of the following description in connection with the drawings wherein.

Figure 1:
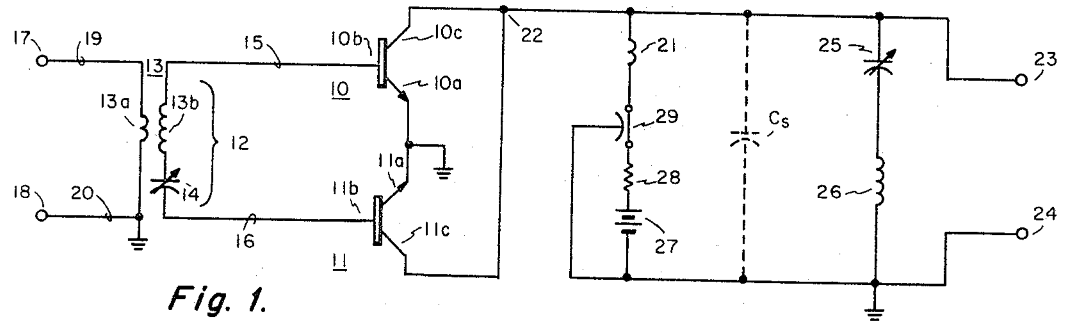
FIG. 1 is a schematic diagram of a frequency doubler embodying our invention.

Referring to FIG. 1, there is shown a frequency doubler circuit comprising first and second type NPN transistors 10 and 11 having their emitter electrodes **10*a* and 11*a* connected to a common reference, or ground, point and their collector electrodes 10*c* and 11*c* connected together. Although type NPN transistors are illustrated in FIG. 1 and in each of the other FIGS. 2 to 4, it shall be understood that type PNP transistors may also be used. A series resonant circuit 12 comprising the secondary winding 13*b* of a transformer 13 and a capacitor 14 is connected by leads 15 and 16 in series with the base electrodes 10*b* and 11*b* of transistors 10 and 11. Input terminals 17 and 18 are connected by leads 19 and 20 to the primary 13*a* of transformer 13. A signal voltage applied between the input terminals is inductively coupled by transformer 13 in series with resonant circuit 12**.

The junction 22 of collector electrodes 10*c* and 11*c* is connected to an output terminal 23, the other output terminal 24 being grounded and connected to the junction of the emitter electrodes 10*a* and 10*b* and to input terminal 18. Coupled across output terminals 23 and 24 is a resonant circuit consisting of a variable capacitor 25, an inductor 26, and the stray capacitance $C_s$ (shown in dashed lines) appearing across the output terminals. The collector voltages are provided by a D.C. supply 27 shown schematically as a battery. D.C. supply 27 is coupled to junction 22 by a filter consisting of a resistor 28, feedthrough capacitor 29 and radio frequency choke 21.

The input impedance of transistors 10 and 11 for current flowing internally in the forward direction from the base electrode to the emitter electrode is low (on the order of 5 to 50 ohms). With the series resonant circuit 12 tuned by variable capacitor 14 to maximize the current through the circuit at the input frequency, the Q of the input loop consisting of resonant circuit 12 and the base-emitter portions of transistors 10 and 11 is high. Typically, Q's of between 20 to 200 are obtained.

When an alternating input signal voltage is applied between terminals 17 and 18, a voltage is induced in secondary winding 13*b* producing a current flow during one half cycle of the input signal through transformer secondary 13*b*, capacitor 14, base 11*b* and emitter 11*a* of transistor 11, and emitter 10*a* and base 10*b* of transistor 10. During the reverse half cycle current flows through these same elements in the reverse direction.

The base-emitter portions act in a manner similar to that of a diode. Thus, if the base electrode 10*b* of transistor 10 is made slightly positive with respect to the emitter eletcrode 10*a*, current will flow from the base 10*b* to the emitter 10*a* through the very low impedance presented by the base-emitter diode. However, if the emitter electrode 10*a* is made positive with respect to the base electrode 10*b*, current will not flow until a voltage referred to as the reverse breakdown voltage is exceeded.

For emitter-to-base voltages greater than the breakdown value, the emitter-base diode presents a low impedance to current flow. This is also true, of course, for transistor 11. Therefore, the input signal applied across input terminals 17 and 18 must be of sufficient magnitude to provide a voltage across the emitter-to-base electrodes of the transistors which will exceed the inverse breakdown voltage during most of the input signal cycle. Since the same current flows through all parts of the input loop consisting of resonant circuit 12 and the base-emitter diodes of transistors 10 and 11, no current unbalance is possible between the base-emitter current of the transistors.

In general, the reverse breakdown voltage of transistors 10 and 11 should not exceed one-tenth the peak voltage across the secondary 13*b* of transformer 13 when it is resonated at the input signal frequency by capacitor 14. A typical transistor having the desired characteristic is a type 2N2485 having a reverse emitter-to-base breakdown voltage of 5 volts or less.

When the base of transistor 10 is driven positive with respect to its emitter, current flows into the collector electrode 10*c* of transistor 10 whereas no current flows into the collector of transistor 11. During the other half cycle of the input signal, current flows into the collector electrode 11*c* of transistor 11 and collector 10*c* does not conduct. Thus, the output current has the form of a full-wave rectified sine wave and is characterized by a strong second harmonic and the absence of the fundamental input frequency. Since a second harmonic voltage is desired across the output terminals 23 and 24, capacitor 25 is tuned to resonate with inductor 26 and stray capacitance $C_s$ at twice the input frequency.

Figure 2:
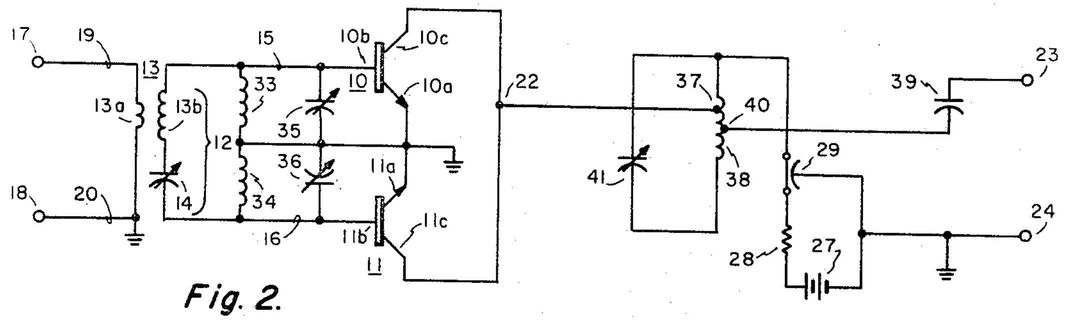
FIG. 2 is a modification of the circuit of FIG. 1 in which capacitors are employed in the base circuits together with means for providing a D.C. return for the transistors.

FIG. 2 shows a modification of the frequency doubler circuit of FIG. 1. In FIG. 2, the base circuit is returned to ground through a pair of radio frequency chokes 33 and 34 to stabilize the circuit and to prevent temperature changes from adversely affecting circuit operation. Variable capacitors 35 and 36 are connected between the base and emitter electrodes of transistors 10 and 11 to provide a current path for the input when the emitter-base diodes of transistors 10 and 11 are non-conducting. Further, capacitors 35 and 36 may be adjusted to compensate for any asymmetries which may be present in the transistor characteristics.

The output circuit shown in FIG. 2 is somewhat different from that shown in FIG. 1 although the two output circuits may be used interchangeably. In FIG. 2, junction 22 is connected to a first tap 37 on an inductor 38 and the output terminal is coupled through a capacitor 39 to a second tap 40 on inductor 38. A variable capacitor 41, tuned to resonate with inductor 38 at the second harmonic of the input frequency, is coupled across inductor 38. The voltage source 27 is coupled through resistor 28 and capacitor 29 to one end of inductor 38.

Figure 3:
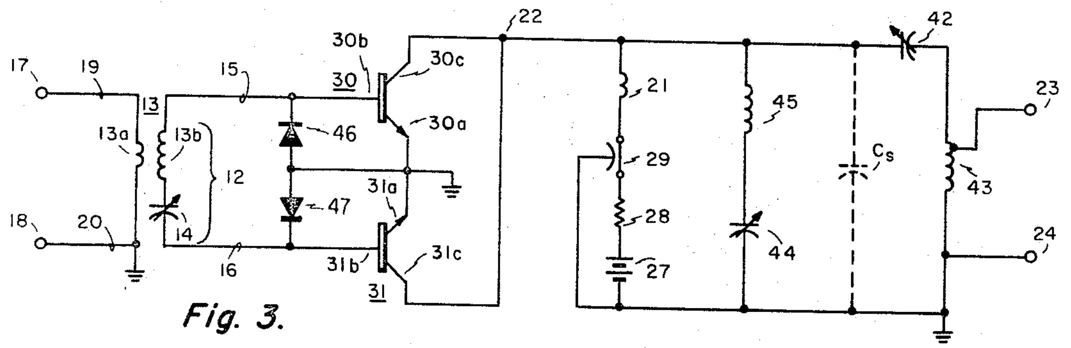
FIG. 3 is another modification of the circuit of FIG. 1 employing diodes to provide signal return paths.

In some cases it is desirable to use transistors having higher reverse breakdown voltages than those required by the circuits of FIGS. 1 and 2. FIG. 3 shows a frequency doubler which may be used with a transistor such as the type 2N404 having a reverse breakdown voltage of about 25 volts. In the circuit of FIG. 3 a diode 46 is connected between the emitter 30*a* and base 30*b* of high reverse breakdown voltage transistor 30 and a second diode 47 is connected between the emitter 31*a* and base 31*b* of transistor 31. Diodes 46 and 47 are poled so that they conduct current from ground to leads 15 and 16 respectively when the base-emitter path of transistors 30 and 31 are non-conducting. Thus, transistors having high reverse emitter-to-base breakdown voltages may be used in this configuration.

A modified output circuit is also shown in FIG. 3. In this embodiment the variable capacitor 42 is tuned to resonate with tapped inductor 43 and shunt capacitance $C_s$ at twice the input frequency. The capacitor 44 is tuned to resonate with inductor 45 at the input frequency and therefore acts to trap any unbalanced fundamental frequency currents which may appear.

Figure 4:
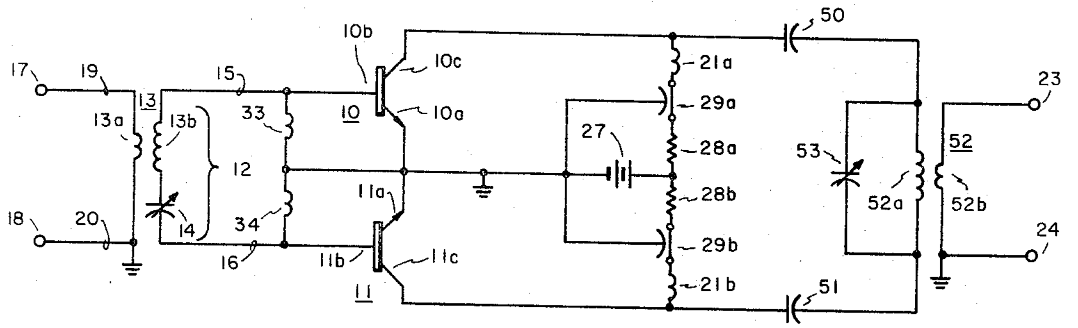
FIG. 4 is a schematic diagram of a push-pull amplifier embodying our invention.

FIG. 4 depicts a push-pull amplifier circuit employing a series resonant circuit 12 of the type used with the frequency doubler circuits of FIGS. 1, 2 and 3. Transistors 10 and 11 are of the type described in connection with FIGS. 1 and 2 having low reverse breakdown voltages and are shown in the push-pull circuit of FIG. 1. However, transistors having higher reverse breakdown voltages may be used in the circuit together with diodes such as 46 and 47 in FIG. 3. Also, the capacitors 35 and 36 of FIG. 2 may be added to the circuit for phase and amplitude control.

The collectors 10*c* and 11*c* of transistors 10 and 11 are coupled through blocking capacitors 50 and 51 to a resonant circuit comprising transformer 52 and variable capacitor 53. Capacitor 53 is tuned to resonate with transformer 52 at the input signal frequency, winding 52*a* of transformer 52 being inductively coupled to output terminals 23 and 24 through winding 52*b*. Collector voltage is supplied to collector 10*c* by D.C. supply 27 through resistor 28*a*, capacitor 29*a* and radio frequency choke 21*a* and to collector 11*c* through resistor 28*b*, capacitor 29*b* and radio frequency choke 21*b*.

The input circuit of FIG. 4 includes a resonant circuit 12 tuned to the input signal frequency and operates in the same manner as described above for the frequency doubler circuits of FIGS. 2, 3 and 4. However, in the output circuit a voltage having the same frequency as the input signal appears across the resonant circuit comprising transformer 52 and capacitor 53 since the current flows through the resonant circuit during each half cycle is in opposite direction.

In a typical frequency doubler, 1.0 watt input signal at 93.95 megacycles produced 1.5 watt output signal at 187.5 megacycles. In the amplifier circuit illustrated in FIG. 4, a 10 watt input signal at 93.75 megacycles produced 36 watts output at the same frequency. With a 10 watt, 187.5 megacycle input signal the output power was 28 watts.

Typical values for the circuits of FIGS. 1 and 4 are given below.

| | Fig. 1 | Fig. 4 |
|---|---|---|
| Transistors 10 and 11 | Type 2N2485 | Type 2N2887. |
| Transformer 13 | Primary inductance=30 nanohenries; secondary inductance =300 nanohenries; coupling coefficient =0.2. | Primary inductance=30 nanohenries; secondary inductance =300 nanohenries; coupling coefficient =0.2. |
| Capacitor 14 | 7–45 picofarads | 7–45 picofarads. |
| Chokes 21 | 1.0 microhenries | 2.0 microhenries. |
| Capacitor 25 | 5–20 picofarads | |
| Inductor 26 | 70 nanohenries | |
| Resistor 28 | 200 ohms | 100 ohms. |
| Capacitors 29 | 1,000 picofarads | |
| Chokes 33 and 34 | | 2.0 microhenries. |
| Capacitors 50 and 51 | 1,000 picofarads | 1,000 picofarads. |
| Transformer 52 | | Primary inductance=75 nanohenries; secondary inductance =20 nanohenries; coupling coefficient =0.1. |
| Capacitor 53 | | 4–30 picofarads. |
| D.C. source 27 | +75 volts | |
| D.C. source 32 | | +125 volts. |

As many changes could be made in the above construction and many different embodiments could be made without departure from the scope thereof, it is intended that all matter contained in the above description or shown in the accompanying drawings shall be interpreted as illustrative and not in a limiting sense.

What is claimed is:

1. A transistorized circuit comprising
(a) first and second transistors each having first, second, and third electrodes,
(b) means coupling the first electrodes of said first and second transistors to a common reference point,
(c) a series resonant circuit coupled between the second electrodes of said first and second transistors,
(d) means for coupling an input signal voltage in series with said series resonant circuit, and
(e) means for coupling the third electrodes of said first and second transistors to an output terminal.

2. A transistorized circuit comprising
(a) first and second transistors each having first, second, and third electrodes,
(b) means coupling the first electrodes of said first and second transistors to a common reference point,
(c) a series resonant circuit coupled between the second electrodes of said first and second transistors,
(d) means for coupling an input signal voltage in series with said series resonant circuit, and
(e) output resonant circuit means coupling the third electrodes of said first and second transistors to an output terminal.

3. A transistorized circuit comprising
(a) first and second transistors each having first, second, and third electrodes,
(b) means coupling the first electrodes of said first and second transistors to a common reference point,
(c) a pair of input terminals,
(d) series resonant circuit means coupling said input terminals to the second electrodes of said first and second transistors, and
(e) output resonant circuit means coupling the third electrodes of said first and second transistors to an output terminal.

4. A frequency multiplier comprising
(a) first and second transistors each having first, second and third electrodes, the first electrode of said first transistor being connected to the first electrode of said second transistor and the third electrode of said first transistor being connected to the third electrode of said second transistor,
(b) a pair of input terminals,
(c) a series resonant circuit tuned to the frequency of a signal applied across said input terminals, said series resonant circuit comprising a capacitor having one terminal connected to the second electrode of one of said transistors and a transformer having one winding connected between the other terminal of said capacitor and the second electrode of said other transistor, said transformer further having a primary winding connected between said pairs of input terminals,
(d) a pair of output terminals, and
(e) an output resonant circuit coupling said pair of output terminals between the first and third electrodes of said first and second transistors, said output resonant circuit being tuned to an even harmonic of the frequency of the signal applied across said input terminals.

5. A frequency multiplier comprising
(a) first and second transistors each having an emitter, base and collector electrode, the emitter electrode of said first transistor being connected to the emitter electrode of said second transistor and the collector electrode of said first transistor being connected to the collector electrode of said second transistor,
(b) a pair of input terminals,
(c) a series resonant circuit tuned to the frequency of a signal applied across said input terminals, said series resonant circuit comprising a capacitor having one terminal connected to the base electrode of one of said transistors and a transformer having one winding connected between the other terminal of said capacitor and the base electrode of said other transistor, said transformer further having a primary winding connected between said pairs of input terminals,
(d) a pair of output terminals, and
(e) an output resonant circuit coupling said pair of output terminals between the emitter and collector electrodes of said first and second transistors, said output resonant circuit being tuned to a second harmonic of the frequency of the signal applied across said input terminals.

6. A frequency multiplier comprising
(a) first and second transistors each having an emitter, base and collector electrode, the emitter electrode of said first transistor being connected to the emitter electrode of said second transistor and the collector electrode of said first transistor being connected to the collector electrode of said second transistor,
(b) a pair of input terminals,
(c) a series resonant circuit tuned to the frequency of a signal applied across said input terminals, said series resonant circuit comprising a capacitor having one terminal connected to the base electrode of one of said transistors and a transformer having one winding connected between the other terminal of said capacitor and the base electrode of said other transistor, said transformer further having a primary winding connected between said pairs of input terminals,
(d) first and second balancing capacitors coupled between the base and emitter electrodes of said first and second transistors respectively,
(e) a pair of output terminals, and
(f) an output resonant circuit coupling said pair of output terminals between the emitter and collector electrodes of said first and second transistors, said output resonant circuit being tuned to a second harmonic the frequency of the signal applied across said input terminals.

7. A frequency multiplier comprising (a) first and second transistors each having an emitter, base and collector electrode, the emitter electrode of said first transistor being connected to the emitter electrode of said second transistor and the collector electrodes of said first transistor being connected to the collector electrode of said second transistors, (b) a pair of input terminals, (c) a series resonant circuit tuned to the frequency of a signal applied across said input terminals, said series resonant circuit comprising a capacitor having one terminal connected to the base electrode of one of said transistors and a transformer having one winding connected between the other terminal of said capacitor and the base electrode of said other transistor, said transformer further having a primary winding connected between said pairs of input terminals, (d) first and second balancing capacitors coupled between the base and emitter electrodes of said first and second transistors respectively, (e) first and second inductances coupled between the base and emitter electrodes of said first and second transistors respectively, (f) a pair of output terminals, (g) an output resonant circuit comprising a coil having first and second taps and a capacitor coupled across the ends of said coil, the collector electrodes of said first and second transistors being coupled to the first tap on said coil and one of said output terminals being coupled to the second tap on said coil, and (h) means coupling the second output terminal to the emitter electrodes of said first and second transistors.

8. A frequency multiplier comprising (a) first and second transistors each having an emitter, base and collector electrode, the emitter electrode of said first transistor being connected to the emitter electrode of said second transistor and the collector electrode of said first transistor being connected to the collector electrode of said second transistor, (b) a pair of input terminals, (c) a series resonant circuit tuned to the frequency of a signal applied across said input terminals, said series resonant circuit comprising a capacitor having one terminal connected to the base electrode of one of said transistors and a transformer having one winding connected between the other terminal of said capacitor and the base electrode of said other transistor, said transformer further having a primary winding connected between said pairs of input terminals, (d) first and second diodes coupled between the base and emitter electrodes of said first and second transistors respectively, said diodes being poled to conduct current from the emitter to base of each of said transistors, (e) a pair of output terminals, and (f) an output resonant circuit coupling said pair of output terminals between the emitter and collector electrodes of said first and second transistors, said output resonant circuit being tuned to a second harmonic of the frequency of the signal applied across said input terminals.

9. The frequency multiplier defined by claim 8 wherein a second series resonant circuit is coupled between the collector and emitter electrodes of said first and second transistors, said second series resonant circuit being tuned to the frequency of the signal applied across said input terminals.

10. An amplifier comprising (a) first and second transistors each having an emitter, base and collector electrode, the emitter electrodes of said first and second transistors being connected together, (b) a pair of input terminals, (c) a series resonant circuit tuned to the frequency of a signal applied across said input terminals, said series resonant circuit comprising a capacitor having one terminal connected to the base electrode of one of said transistors and a transformer having one winding connected between the other terminal of said capacitor and the base electrode of said other transistor, said transformer further having a primary winding connected between said pairs of input terminals, (d) an output parallel resonant circuit coupled between the collector electrodes of said first and second transistors, said parallel resonant circuit being tuned to the frequency of the signal applied across said input terminals, and (e) a pair of output terminals coupled to said output resonant circuit.

11. An amplifier comprising (a) first and second transistors each having an emitter, base and collector electrode, the emitter electrodes of said first and second transistors being connected together, (b) a pair of input terminals, (c) a series resonant circuit tuned to the frequency of a signal applied across said input terminals, said series resonant circuit comprising a capacitor having one terminal connected to the base electrode of one of said transistors and a transformer having one winding connected between the other terminal of said capacitor and the base electrode of said other transistor, said transformer further having a primary winding connected between said pairs of input terminals, (d) first and second inductances coupled between the base and emitter electrodes of said first and second transistors respectively, (e) a pair of output terminals, and (f) an output resonant circuit coupled between the collector electrodes of said first and second transistors, said output resonant circuit comprising a capacitor and a transformer having one winding coupled across said capacitor and the other winding coupled to said output terminals, said resonant circuit being tuned to the frequency of the signal applied across said input terminals.

References Cited

UNITED STATES PATENTS

| | | | |
|---|---|---|---|
| 3,230,396 | 1/1966 | Boelke | 307—88.5 |
| 3,263,172 | 7/1966 | Gunn | 330—15 X |

ARTHUR GAUSS, *Primary Examiner.*

S. D. MILLER, *Assistant Examiner.*